United States Patent [19]

Kwasnick et al.

[11] Patent Number: 5,838,054
[45] Date of Patent: Nov. 17, 1998

[54] CONTACT PADS FOR RADIATION IMAGERS

[75] Inventors: Robert Forrest Kwasnick, Niskayuna; Brian William Giambattista, Scotia; George Edward Possin, Niskayuna; Jianqiang Liu, Clifton Park, all of N.Y.

[73] Assignee: General Electric Company, Schenectady, N.Y.

[21] Appl. No.: 772,453

[22] Filed: Dec. 23, 1996

[51] Int. Cl.$^6$ .............. H01L 31/062; H01L 31/113; H01L 31/00
[52] U.S. Cl. .............. 257/457; 257/292; 257/457
[58] Field of Search ............ 257/292, 457, 257/459, 781, 776, 773, 782, 786, 291

[56] References Cited

U.S. PATENT DOCUMENTS

| | | | |
|---|---|---|---|
| 4,725,890 | 2/1988 | Yaniv et al. | 358/285 |
| 4,739,414 | 4/1988 | Pryor et al. | 358/285 |
| 4,889,983 | 12/1989 | Numano et al. | 257/292 |
| 5,202,575 | 4/1993 | Sakai | 257/292 |
| 5,532,180 | 7/1996 | den Boer et al. | 437/40 |
| 5,614,727 | 3/1997 | Mauri et al. | 257/43 |

Primary Examiner—Mahshid D. Saadat
Assistant Examiner—Jhihan B. Clark
Attorney, Agent, or Firm—Donald S. Ingraham; Douglas E. Stoner

[57] ABSTRACT

Contact pads for providing external electrical connection to components on a radiation imager having a photosensor array include a body of the material utilized for fabrication of the photosensors with an indium tin oxide (ITO) top layer disposed over the photosensor material to provide a contact region. A metal contact surface can also be disposed over the ITO. A barrier dielectric material is further disposed over portions of the contact pad.

10 Claims, 4 Drawing Sheets

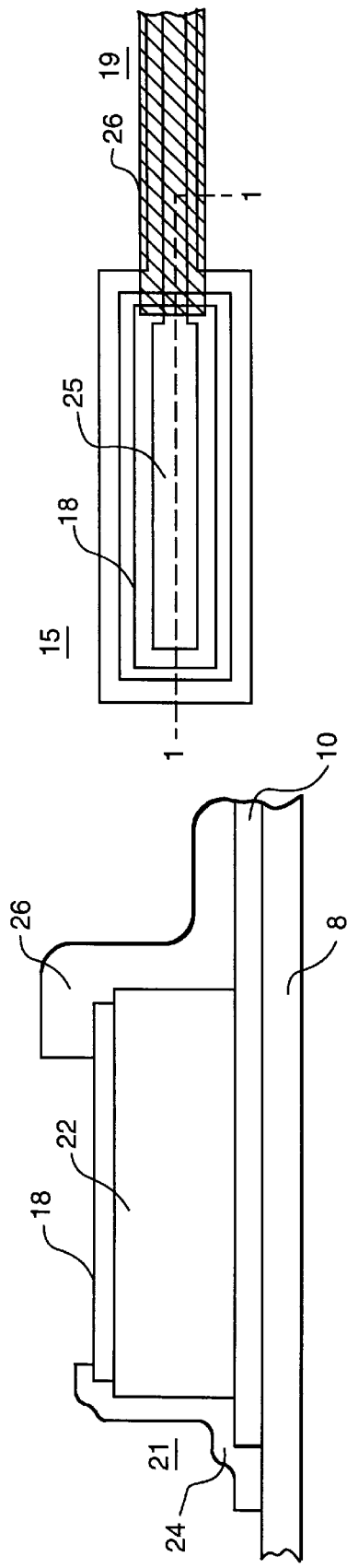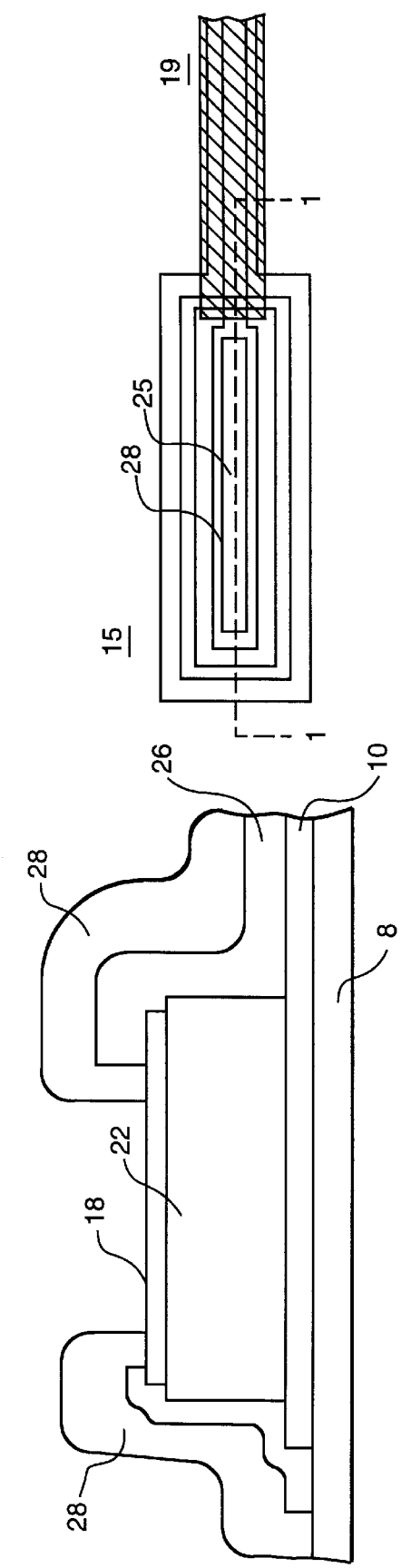

CONTACT PADS FOR RADIATION IMAGERS

This invention was made with U.S. Government support under Government Contract No. 70NANB5H1099 awarded by NIST. The U.S. Government has certain rights in this invention.

FIELD OF THE INVENTION

This invention relates generally to contact pads for radiation imagers formed from an array of photosensitive elements, and more particularly to a contact pad structure which is consistent with a process using a reduced number of process steps.

BACKGROUND OF THE INVENTION

Radiation imagers with a photosensor array are commonly used in imaging applications such as X-ray imaging and facsimile devices. The photosensitive elements in the array, typically photodiodes, convert incident radiant energy into a charge which is separated inside the photodiodes by maintaining a reverse bias across all the photodiodes with a common electrode maintained at a predetermined voltage. The pixels are disposed in a matrix arrangement with rows and columns of address lines being disposed to enable selective addressing and readout of pixels. Each array pixel typically has a photodiode which is connected to a source (or drain) contact of a thin film transistor (TFT). The address lines oriented along the rows, called scan lines, are typically formed from the same gate metal used for the TFTs. When a particular row is read out, the stored photodiode charge on the photodiodes in that row passes onto data lines which are disposed in columns perpendicular to the rows. The data lines typically comprise the same material as the source/drain contact material of the TFT.

Imagers are typically fabricated on large area substrates, such as glass. By a sequence of process steps including thin film deposition, photolithographic patterning and thin film etching, the imager structure is formed on the substrate. Both photodiodes and TFTs preferably comprise amorphous Si (a-Si) deposited, for example, by plasma enhanced chemical vapor deposition (PECVD).

Contact fingers are also formed on the substrate during the formation of the array. These contact fingers are extensions of the scan and data lines and common electrode lines from the array to near the perimeter of the substrate and allow connection of external circuitry to the array. At the end of a contact finger is a contact pad, which necessarily has a conducting material as the topmost material over at least part of its surface. Because the number of scan and data address lines on the array may number in the thousands, external contact from driving and read out circuitry is typically made by flexible connectors which are pressed or bonded into contact with the contact pad's surface.

Structures and methods for fabricating imagers with a reduced number of process steps include U.S. Pat. Nos. 5,399,844; 5,435,608 and 5,480,810 issued Mar. 21, 1995; Jul. 25, 1995 and Jan. 2, 1996, respectively, and assigned to the same assignee as the present invention. In array fabrication, the number of conducting metal depositions is desirably reduced, for example to that of depositing the gate metal and depositing the source/drain (SD) metal; the common electrode can be formed during the same photolithographic patterning step, and from the same material as the source/drain metal, and not from a separate conductor.

The contact pad is particularly vulnerable to the corrosive effects of moisture because it cannot readily be sealed against moisture exposure due to the necessity of its being in contact with the flexible connectors. Other areas of the photosensor array can be reasonably protected by an inorganic dielectric barrier layer. It has been determined that the metals typically used as the gate and source/drain metals, e.g., Cr, Ti, Mo, and Al, tend to form surface oxides which will inhibit good contact, or are, to varying degrees, susceptible to corrosion. The preferred contact pad surface material is indium tin oxide (ITO) or related conducting oxide material as it is less susceptible to these problems.

However, ITO has proven to be an insufficient barrier to corrosion of the metal directly underlying it. Moisture can diffuse through the relatively thin polycrystalline ITO and react with underlying metals.

Accordingly, while the source/drain metal or the gate metal are possible choices for the contact pad surface material, which will not require a separate conducting material, they suffer from possible corrosion or contact problems, degrading imager performance and life.

It is thus desirable in an imager array to have a contact pad structure which does not necessitate additional fabrication process steps and which does not suffer from excessive corrosion and contact reliability problems.

It is another object of this invention to provide a radiation imager contact pad which results in a reduced number of photomasking steps.

SUMMARY OF THE INVENTION

In accordance with this invention, a simplified radiation imager contact pad structure is fabricated simultaneously with the remainder of the radiation imager array so that no process steps beyond those used to fabricate the array are required. A contact pad body of photodiode material is formed in the contact pad region simultaneously with the formation of the array photodiodes. The photodiode has a layer of ITO on top of it which is the topmost surface to which external electrical contact is made. Subsequently, during TFT source and drain electrode patterning, the source and drain electrode material is patterned to partially overlap the top surface of the photodiode material and to electrically contact, and form part of, the contact fingers. An inorganic dielectric barrier is patterned so that no source and drain electrode material is exposed to ambient conditions, while also leaving ITO exposed on top of the contact pad. Both the scan and data line contact pads are made in the fashion so as to reduce structural and process complexity.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIGS. 2, 3A, 4A, 5A and 6A are cross-sectional views, respectively, showing the sequence of steps in fabrication of contact pads and associated contact fingers in accordance with the present invention. The dotted lines 1—1 in each of the top views 3B, 4B, 5B and 6B indicate the portion shown by the associated view 3A, 4A, 5A and 6A, respectively. Also, these Figures are not drawn to scale with the vertical dimensions exaggerated for clarity in order to better illustrate the exceedingly thin layers.

DETAILED DESCRIPTION OF THE INVENTION

Figure 1:
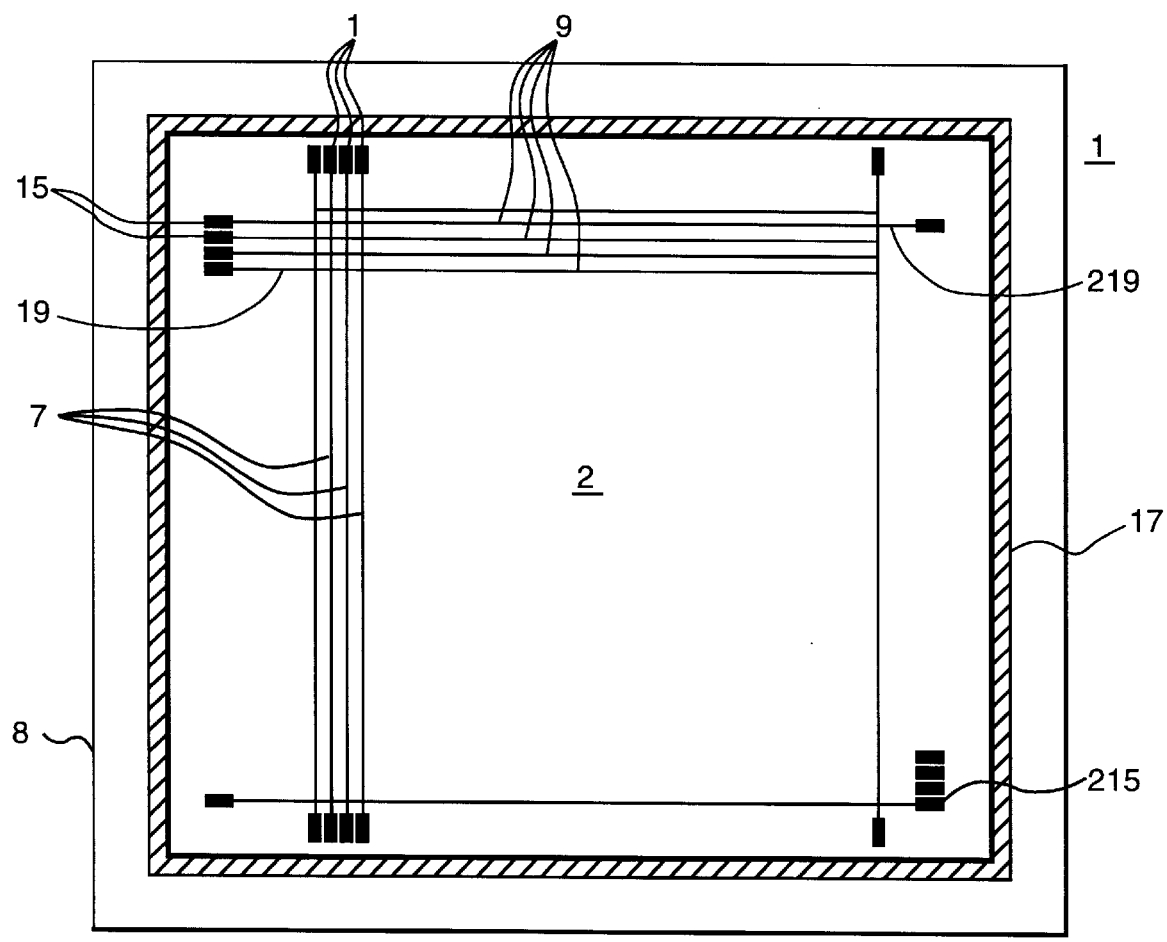
FIG. 1 is a simplified view of a radiation imager incorporating the invention.
Figure 7:
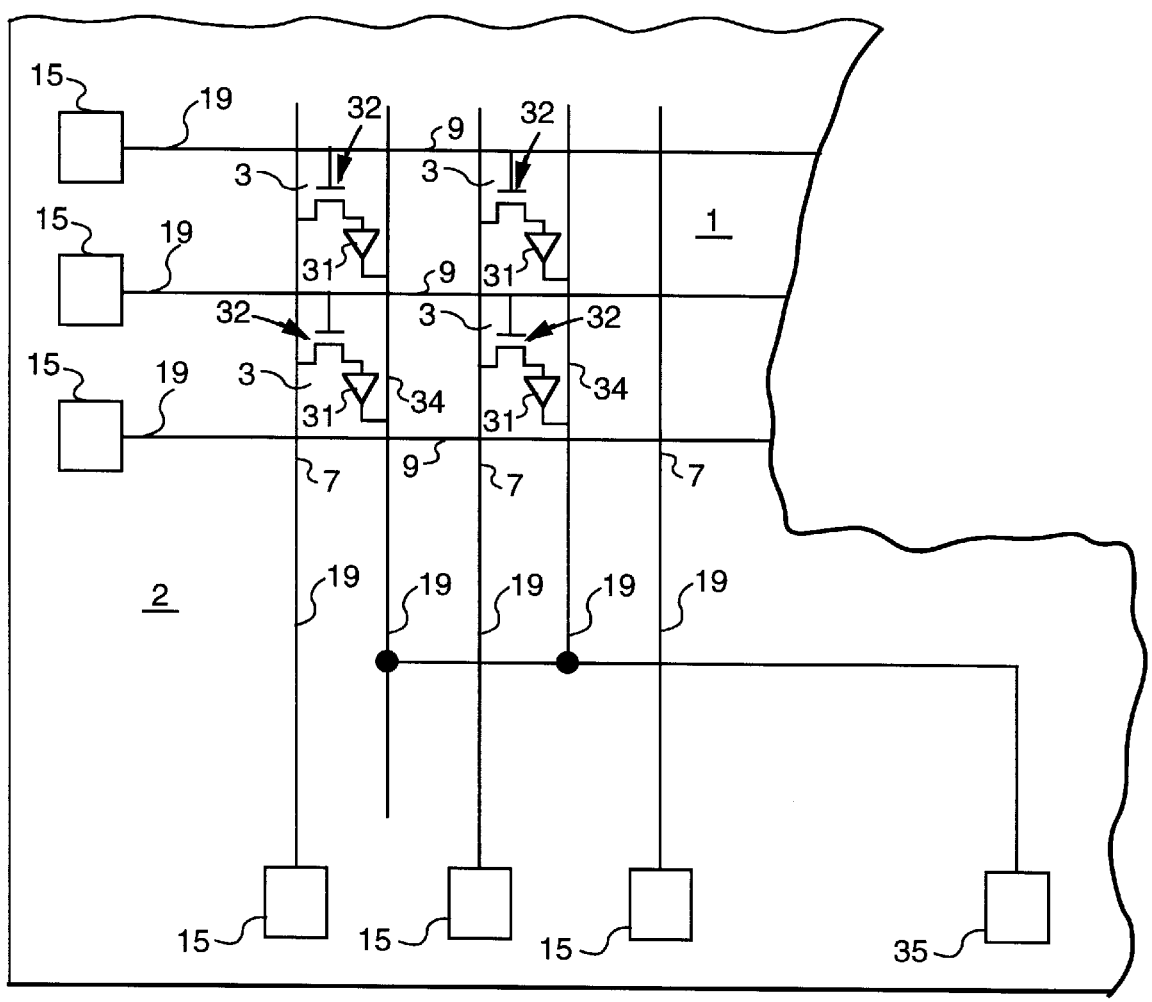
FIG. 7 is a simplified enlarged view of a portion of FIG. 1.

Referring first to FIGS. 1 and 7, radiation imager 1 includes a photosensor array 2 on insulating imager substrate 8 including pixels such as 3 (FIG. 7) between the intersections of horizontal scan lines 9 and orthogonal vertical data lines 7.

Each pixel 3 includes a radiation sensitive element such as photodiode 31 and a thin film transistor (TFT) 32 switch. The radiation sensitive element (or photosensor) 31 in each pixel of the array accumulates a charge in response to incident photons. Each respective photodiode in a row is addressed by biasing scan lines 9 coupled to the gate of respective TFTs in a row so as to selectively cause each TFT to become conductive to enable charge accumulated on the photodiode to be selectively read from output data lines 7 that are coupled to the source (or alternatively the drain) electrode of respective TFTs in a column. The bias gating voltages are applied from an external source (not shown) through contact pads such as 15 which are positioned along the outer edges of photosensor array 2. Contact pads 15 are electrically connected (as described in the aforementioned patents) to contact fingers 19 which in turn are connected to scan lines 9 and data lines 7. Imager 1 may further comprise a ground ring 17 disposed around photosensor array 2 to provide static charge protection. Contact fingers 15 are typically disposed on substrate 8 inside of ground ring 17.

Figure 2:
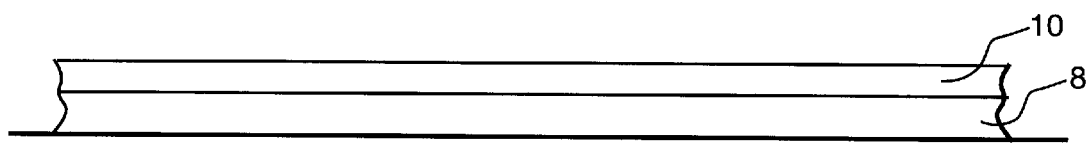
Figure 3A:
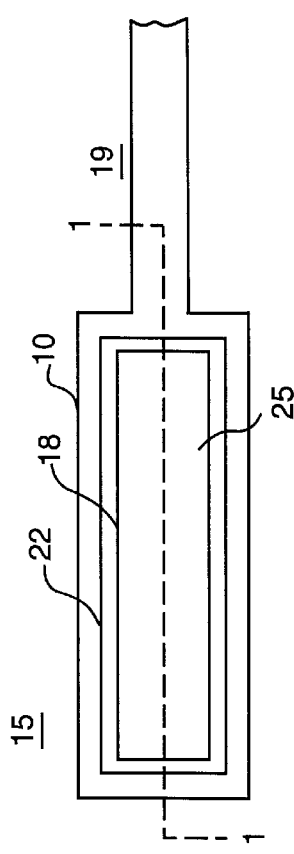
Figure 3B:
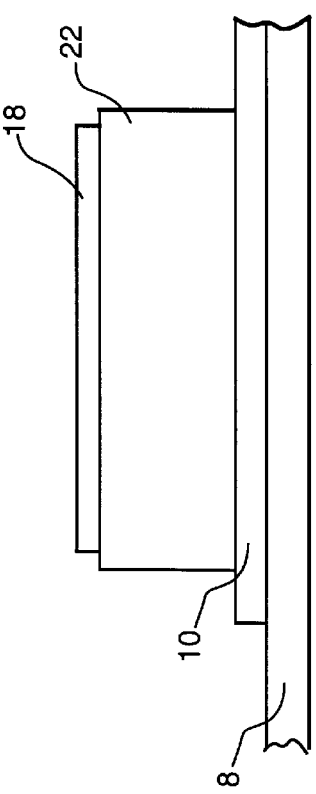

Referring next to FIGS. 2; 3A and 3B; and 4A and 4B; in one embodiment of the invention, gate metal 10 of contact pad 15 at the contact pad end of contact fingers 19 is formed on substrate 8 and photodiode body 22 is formed over gate metal 10, which gate metal was previously patterned in the array and contact pad regions. The gate metal 10 is not required to underlie the photodiode material 22 in contact pad 15, but it may improve adhesion of the photodiode material 22 relative to its deposition directly onto substrate 8. The photodiode material 22 is then patterned and etched to form a plurality of photodiode bodies. The photodiode bodies are formed within each respective pixel 3 (see FIGS. 1 and 7) of photosensor array 2. At the same time, photodiode material 22 is also patterned into islands in the contact pad 15 region (see FIG. 3). This material is not used as a photosensitive element but becomes part of the pad structure of the contact finger. The photodiode material 22 of contact pad 15 consists of layers of doped and undoped a-Si with total thickness of approximately 0.5 to 2.0 microns, and a top layer of ITO 18 with a thickness of approximately 0.1 microns with a range of approximately 0.05 to 0.2 microns.

Figure 4A:
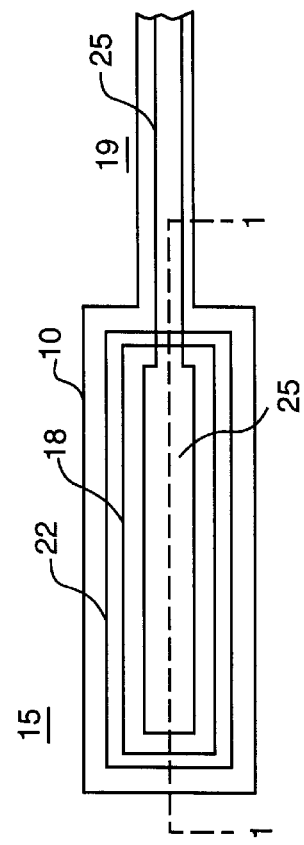
Figure 4B:
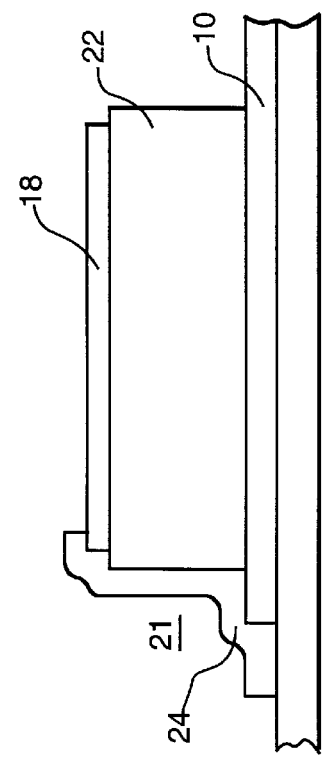

Within each pixel 3 (see FIG. 7), the purpose of the thin ITO layer is to enhance the electrical conductivity of top diode layer to improve performance and ensure reliable contact of common electrode 34 to photodiode 31 tops. In each contact pad 15, ITO 18 forms the top contact surface of the contact pad. ITO is a desirable material because it is chemically stable and resists corrosion and the formation of insulating oxides. ITO layer 18 may be substantially coincident with the photodiode material 22 or slightly smaller, depending on the details of the patterning and etch processes. In a following step in the imager fabrication process of photosensor array 2, a dielectric layer is disposed during dielectric formation of the TFTs 32 in the array. Dielectric layer 24 is patterned and etched from the top of the contact pad region 25 as shown in FIG. 4, and may be a combination of PECVD silicon nitride (SiNx) and silicon oxide with total thickness of approximately 0.15 to 0.5 microns.

In a following process step, source and drain metal 26 (FIGS. 5A and 5B) is deposited, patterned and etched to provide electrical contact between ITO layer 18 and the underlying gate metal 10 or the source and drain (SD) metal contact in contact finger 19, thus allowing a continuous contact between the ITO and scan lines 9 and data lines 7 (see FIG. 1). SD metal 26 is etched so as to leave ITO 18 exposed over at least a portion of contact pad 15. SD metal 26 may comprise, for example, Mo or Cr, or a combination thereof with thickness of approximately 0.1 to 1.0 microns. It is to be noted that the figures are not to scale, particularly in the vertical direction, since the layers are about 2 microns in height, while the exposed ITO contact area is about 150 microns by 2 to 3 mm.

In a final step, photosensor array 2, contact fingers 19, and contact pads 1 and 15 are covered with a protective dielectric barrier layer 28 which is patterned and etched so that it is removed from most of the contact pad 15, as shown in FIG. 6A and 6B. Barrier layer 28 entirely covers the SD metal 26, including the region where SD metal 26 contacts ITO layer 18. This inhibits chemical corrosion and damage to SD metal 26 and ITO layer 18.

The common electrical contact of diodes 31 is fabricated from the same layer (and material) used to form the source and drain electrodes of TFTs 32 and data lines 7. The common electrode lines are positioned halfway between adjacent data lines, effectively making a common electrode 34 (see FIG. 7) out of SD electrode material 26 with the vertical lines connected at the edges of radiation imager 1, and by using diode islands 22 in contact pad 15. One or more contact pads 35 are provided to enable external connection to common electrode 34.

SD metal 26 and common electrode layer 34 each comprise, for example, Mo or Cr; other metals, or multi-layers of metals may be used, but Al presents challenges because during a wet etch (e.g., see FIGS. 5A and 5B) corrosion of exposed ITO layer 18 may occur. If Al is required as the SD metal 26 for electric noise purposes, an additional metal layer (not shown) which connects contact fingers 19 to ITO 18 on top of contact pad 15 is typically deposited.

Putting the diode island material in the contact pad structures enables use of the ITO layers 18 on the diode island material for contact, thus eliminating the need for an additional contact layer and its associated masking step.

It is to be noted that in the present invention SD metal 26 used for the source and drain electrodes of transistors 32 is also used for data lines 7 and common electrode lines 34, all of which is formed at the same time by the same process steps. Similarly, the gate electrode metal of transistors 32 and scan lines 9 are formed of the same metal and at the same time and by the same process steps. The cross section of fingers 19 may not be identical to the cross section of the array address lines to which they are electrically connected, and the fingers may vary in cross section from one another.

It is to be further noted that the subject invention utilizing a combination SD metal and common electrode layer reduces the number of photomask process steps required for the fabrication of the contact pad, reducing fabrication time, expense, and possible problems or defects introduced by an additional process step if it were required. The process requires only three conductive layer depositions (and associated photomask and etch steps) which are disposed in the following order: gate metal 10, ITO strap 18 on photodiode material 22, and the SD metal 26 which also forms common electrode lines which run across and connect the tops of the photodiodes. There may be a thin metal cap layer for TFT 32 islands, typically 10 to 50 nm of Mo. However, that layer is essentially provided as part of the TFT 32 island fabrication and is not part of the contact pad fabrication.

While only certain features of the invention have been illustrated and described herein, modifications and changes will occur to those skilled in the art. It is, therefore, to be understood that the appended claims are intended to cover such modifications and changes that fall within the true spirit of the invention.

What is claimed is:

1. A contact pad for a radiation imager, said imager comprising an array of photodiodes which are fabricated of a photodiode material and a conductive oxide, the contact pad comprising:

a body comprising said photodiode material;

said body being positioned proximate an edge of said array; and a contact layer comprising said conductive oxide; said contact layer being disposed over at least part of said body to provide a contact region, said conductive oxide in said contact region being at least partially exposed to form a top contact surface to enable coupling an external electrical connection to said array via said top surface.

2. The radiation imager contact pad of claim 1 wherein a metallic contact material is disposed in electrical contact with at least a portion of said top contact surface.

3. The radiation imager contact pad of claim 1 wherein said photodiode material comprises a-Si and said conductive oxide comprises indium tin oxide.

4. The radiation imager contact pad of claim 2 wherein said metallic contact material is disposed in contact with said photodiode material body and a portion of said top contact layer.

5. The radiation imager contact pad of claim 2 wherein said metallic contact material comprise metals selected from the group consisting of Mo and Cr.

6. The radiation imager contact pad of claim 3 further comprising a barrier layer overlaying at least a portion of said contact pad, said barrier layer comprising a dielectric material.

7. The radiation imager contact pad of claim 6 wherein said barrier layer comprises SiNx.

8. The radiation imager contact pad of claim 6 wherein said barrier layer is disposed to overlie said metallic contact material around said contact pad and at least a portion of said conductive oxide top contact layer.

9. The radiation imager contact pad of claim 8 further comprising a gate metal layer disposed under said contact pad body and wherein said metallic contact material is disposed in electrical contact with said gate metal layer.

10. The radiation imager contact pad of claim 8 further comprising a source and drain metal contact, wherein said metallic contact material is disposed in electrical contact with said source and drain contact.

* * * * *